(12) United States Patent
Hsiao

(10) Patent No.: US 6,812,798 B1
(45) Date of Patent: Nov. 2, 2004

(54) LC QUADRATURE OSCILLATOR HAVING COUPLING CIRCUITS

(75) Inventor: Shuo-Yuan Hsiao, Hsinchu (TW)

(73) Assignee: Avid Electronics Corp., Hsinchu (TW)

( * ) Notice: Subject to any disclaimer, the term of this patent is extended or adjusted under 35 U.S.C. 154(b) by 0 days.

(21) Appl. No.: 10/602,868

(22) Filed: Jun. 25, 2003

(30) Foreign Application Priority Data

May 15, 2003 (TW) .......................................... 92113160 A

(51) Int. Cl.[7] ................................................ H03B 5/02
(52) U.S. Cl. ................ 331/46; 331/177 V; 331/117 FE
(58) Field of Search ............................. 331/46, 177 V, 331/117 FE, 45, 135, 117 R

(56) References Cited

U.S. PATENT DOCUMENTS 5,912,596 A * 6/1999 Ghoshal ................. 331/117 R
6,008,701 A * 12/1999 Gilbert ........................ 331/57
6,456,167 B1 * 9/2002 Huang .......................... 331/46
6,639,481 B1 * 10/2003 Ravi et al. .............. 331/177 V

* cited by examiner

Primary Examiner—Robert Pascal
Assistant Examiner—Joseph Chang
(74) Attorney, Agent, or Firm—Rosenberg, Klein & Lee

(57) ABSTRACT

A quadrature oscillator capable of lowering phase noise and power dissipation is disclosed. The oscillator circuit includes two symmetrical oscillators (11) (12) formed by cross-coupled transistor pairs with positive feedback structure to produce negative resistance, two LC circuits (13) (14) coupled to the above oscillators (11) (12) to produce positive resistance offsetting the negative resistance through the oscillators (11) (12), and two coupling circuits (15) (16) coupled to the oscillators (11) (12) to produce quadrature phase outputs, wherein the transistor pairs in each coupling circuit (15) are respectively connected to the corresponding transistor pairs in the two oscillators (11) (12), to prevent the operating point of the oscillator transistors from shifting toward the linear region.

8 Claims, 6 Drawing Sheets

LC QUADRATURE OSCILLATOR HAVING COUPLING CIRCUITS

BACKGROUND OF THE INVENTION

1. Field of the Invention

The present invention relates to a quadrature oscillator, in particular to an oscillator for use in wireless communication devices having the advantages of low phase noise and low power dissipation.

2. Description of Related Arts

A quadrature oscillator is an oscillator that outputs with four different phases mutually separated by a quarter of a cycle, or 90 electrical degrees. This type of oscillator is generally used in the transceiver circuit of communication devices, such as cellular phones, wireless telephones, wireless networking devices, and all short-range blue-tooth communication devices. The transceiver circuits of these communication devices usually have a super heterodyne architecture, requiring a high precision filter for image rejection. However, it is difficult to produce transceiver ICs embedded with high precision filters. Therefore, the usual practice is to have a high precision filter soldered onto the transmitter circuit, thus posing a space constraint for circuit layout and making it difficult to reduce the related production costs.

To solve the above problems, direct conversion or low IF transceiver architecture is proposed to avoid the use of an image rejection filter. To support the above two architectures, transceivers have to rely on the oscillator outputs with precise phase quadrature. How to develop a high precision oscillator having quadrature output has become an interesting topic for discussion in the industry.

The above quadrature oscillator can be built using any one of the three methods mentioned below. The first method is to use two frequency dividers operated out-of-phase to produce the quadrature phase outputs. The second method is to use a conventional two-phase oscillator with a phase shifter such as a poly-phase filter to produce quadrature phase outputs. The third method is to use two cross-coupled two-phase oscillators, on which the present invention is based. The cross coupling of two two-phase oscillators forms a quadrature oscillator, as shown in FIG. 11, including:

two symmetrical oscillators (75) (76) being respectively connected by transistor pairs (M1, M2) (M3, M4) in a positive feedback structure to produce negative resistance;

two tank circuits (73) (74) being respectively connected to the above oscillators (75) (76) to produce positive resistance offsetting the negative resistance through the above oscillators (75) (76); and two coupling circuits (71) (72) being respectively connected to the oscillators (75) (76) to produce quadrature phase outputs.

Under the above-mentioned architecture, one of the two oscillators (75) (76) has two outputs with phase shift of 0 and 180 electrical degrees, and the other outputs with phase shift of 90 and 270 degrees.

Since the oscillation frequency of the oscillator largely depends on the resonant frequency of the tank circuit and the parasitic capacitance in the active circuit, and the output amplitude is dependent on the Q of the tank circuit and the negative resistance in the active circuit, it is clear that the tank circuit plays an important role in this type of oscillator. However, as the Q of the tank circuit is largely determined by the manufacturing process of the semiconductor, designers can do little to alter its value, but it is possible to change the active circuit to improve the output characteristics of the oscillator using economical means.

For an oscillator, the characteristics of the active circuit can be analyzed through its linear characteristics in steady state. The negative resistance generated by per unit output current can be used as an indicator. In FIG. 11, the quadrature oscillator is formed by two cross-coupled symmetrical oscillators. Taking either one of the two for the present analysis will produce identical result. Accordingly, the small signal conductance of the oscillator at point V0 can be represented by:

$$G_2 = -g_{m1} + \frac{g_{l1}g_{l3} + g_{l1}g_{m1}}{g_{m3} + g_{mb3} + g_{l1} + g_{l3}}$$

where $g_m$ represents the transistor gate-to-source transconductance, $g_l$ represents the small signal conductance across the drain and source, and $g_{mb}$ represents the transistor bulk-to-source transconductance.

From the above-mentioned architecture of the quadrature oscillator, it is clear that the source terminals of transistor pairs (M5, M6) (M7, M8) in the coupling circuits (71) (72) are respectively connected in series to the drain terminals of transistor pairs (M1, M2) (M3, M4) in the two oscillators (75) (76). At the steady state operating point, the four output terminals are at the same potential $V_0=V_{180}=V_{90}=V_{270}$. For the transistor M1, the potential across its drain and source terminals is equal to $V_{DS1=V270}-V_{TH5}$, which is lower than the potential across the gate and source terminals, that means the transistor M1 is affected by the coupling transistor M5, causing the operating points of transistor M1 to shift toward the linear region and resulting in the decrease of transconductance ($g_m$).

Under the pre-condition not to increase the operating current, it is necessary to increase the length/width of coupling transistor M5 such that the physical appearance of transistor M5 will be considerably larger than oscillator transistor M1, but this can cause proportional increase in parasitic capacitance that will decrease the oscillation frequency and the tunable frequency range.

From the foregoing, it is found that the operating point of the transistors in the conventional quadrature oscillator is seriously affected by the coupling transistors to shift toward the linear region, causing degradation of the signal conductance and the operating characteristics of the quadrature oscillator.

SUMMARY OF THE INVENTION

The main object of the present invention is to provide an oscillator that can effectively prevent shifting of the operating point of the oscillator toward the linear region in order to boost transistor transconductance, without degrading the oscillation frequency and the amplitude of the quadrature oscillator.

To this end, the architecture of the quadrature oscillator in accordance with the present invention comprises:

two symmetrical oscillators being connected by two cross-coupled transistors in a positive feedback structure to produce negative resistance;

two LC circuits being respectively connected to the above oscillators to produce positive resistance offsetting the negative resistance through the above oscillators; and two coupling circuits being coupled to the above oscillators in order to produce outputs with phase quadrature.

The two coupling circuits are each formed by two identical transistors, where the drain terminals of the transistors are respectively connected to the source terminals of the oscillators, such that the operating point of the oscillator transistor is not affected by the coupling circuit and continues to work in the saturation region, thus reducing phase noise and maintaining the operating current with low power dissipation.

The features and structure of the present invention will be more clearly understood when taken in conjunction with the accompanying drawings.

DETAILED DESCRIPTION OF THE PREFERRED EMBODIMENT

Figure 1:
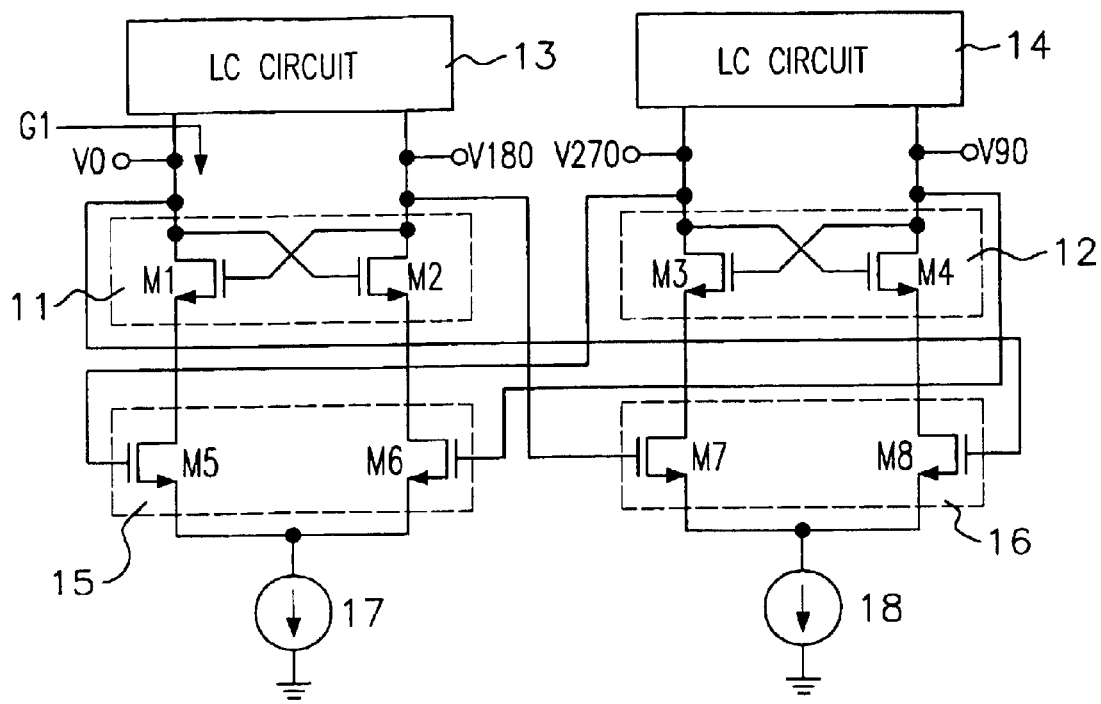
FIG. 1 is a schematic circuit in accordance with the first preferred embodiment of the invention.

The present invention provides a preferred embodiment as shown in FIG. 1, comprising:

two symmetrical oscillators (11) (12) being formed by cross-coupled transistor pairs (M1, M2) (M3, M4) in a positive feedback structure to produce negative resistance;

two LC circuits (13) (14), wherein the outputs are respectively connected to the oscillators (11) (12) in series to produce positive resistance offsetting the negative resistance through the oscillators (11) (12);

two coupling circuits (15) (16) that are formed by transistor pairs (M5, M6), (M7, M8), whereby the transistors pairs (M5, M6), (M7, M8) are respectively connected in series with corresponding transistor pairs (M1, M2) (M3, M4) of the two oscillators (11) (12) and share the same current sources;

the transistor pairs (M5, M6), (M7, M8) have constant current sources (17) (18);

the gate terminals of the transistor pairs (M5, M6) (M7, M8) in the coupling circuits (15) (16) are cross-coupled to the output of the LC circuits (13) (14) to produce outputs with four phase angles (V0, V180, V270, V90); and the drain terminals of the transistor pairs (M5, M6) (M7, M8) in the coupling circuits (15) (16) are respectively connected in series to the source terminals of the transistor pairs (M1, M2) (M3, M4) in the oscillators (11) (12). Under the above architecture, the small signal conductance at point V0 can be expressed as $$G_1 = (g_{m1} - g_{l1}) \left[ \frac{-g_{l3}}{g_{m1} + g_{mb1} + g_{l1} + g_{l3}} \right],$$

where $g_m$ represents transistor gate-to-source transconductance, $g_l$ represents the small signal conductance across the drain and source terminals, and $g_{mb}$ represents the transistor bulk-to-source transconductance.

From the above formula, it can be demonstrated that the quadrature oscillator in accordance with the present invention possesses greater negative conductance for small signals $G_2$ as compared with conventional oscillators.

$$G_2 = -g_{m1} + \frac{g_{l1}g_{l3} + g_{l1}g_{m1}}{g_{m3} + g_{mb3} + g_{l1} + g_{l3}}$$

Figure 11:
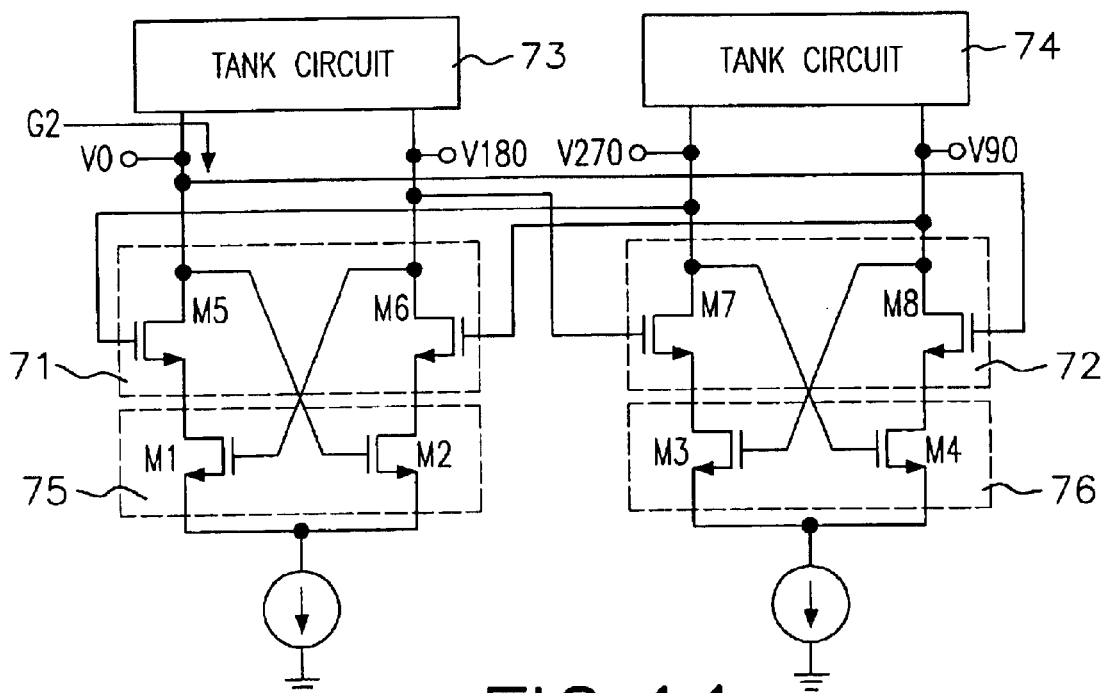
FIG. 11 is a schematic diagram of the circuit in a conventional quadrature oscillator.
Figure 2:
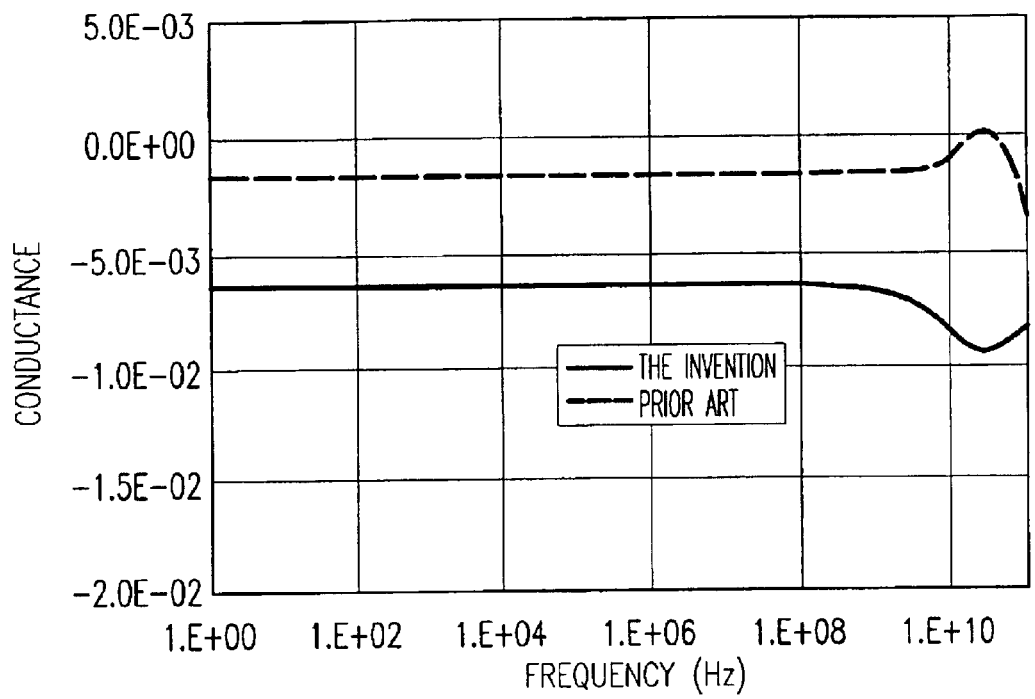
FIG. 2 is a comparative diagram of the characteristic curves of negative conductance in relation to different operation frequencies using the first preferred embodiment.

This point can be demonstrated by simulation of the circuit action using selected parameters. It is assumed that the shunt current through the quadrature oscillator in the first embodiment in FIG. 11 is 15 mA; the width/length of the transistor in the circuit are 50 $\mu$m/0.35 $\mu$m; and the operating voltage is 3V. The characteristic curve for negative conductance in relation to different operation frequencies is shown in FIG. 2, where the curve denoted by square dots represents the relationship between the negative conductance and frequency in the present invention, and the curve denoted by triangular dots represents the negative conductance and frequency demonstrated for the conventional quadrature oscillators. From the comparison of these two characteristic curves, it is therefore clear that the quadrature oscillator in the present invention possesses greater negative conductance. By allowing the oscillator transistors (M1, M2) (M3, M4) to be operated in the saturation region, the phase noise can be maintained to a minimum level. By creating the quadrature oscillator with a small circuit area, chip designers are left with more freedom to optimize the circuit design of the quadrature oscillator.

Figure 3:
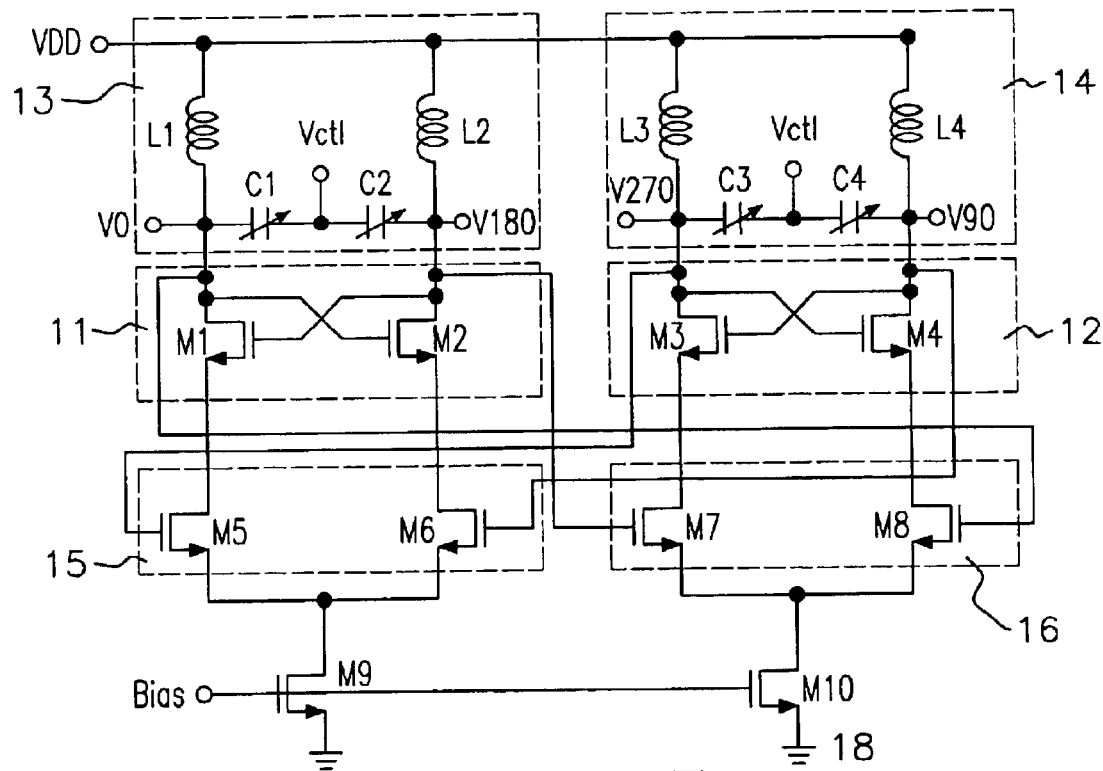
FIG. 3 is a schematic diagram of the circuit in the quadrature oscillator in accordance with the second preferred embodiment of the invention.
Figure 4:
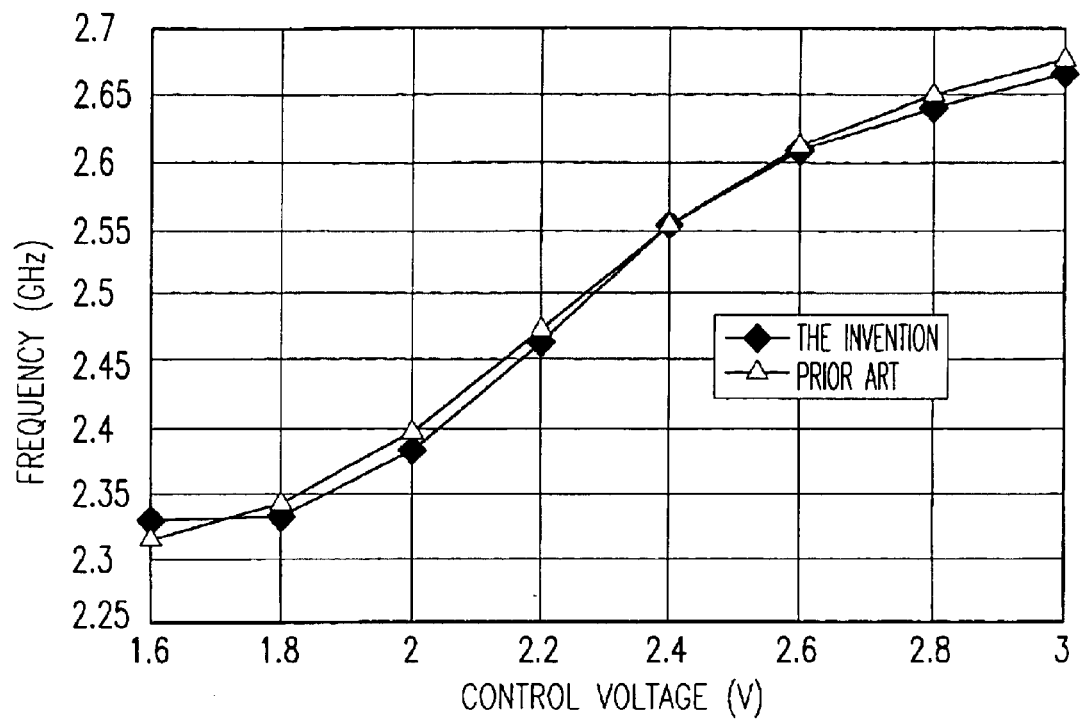
FIG. 4 is a comparative diagram of the characteristic curves of oscillation frequency in relation to different control voltages using the second preferred embodiment.
Figure 5:
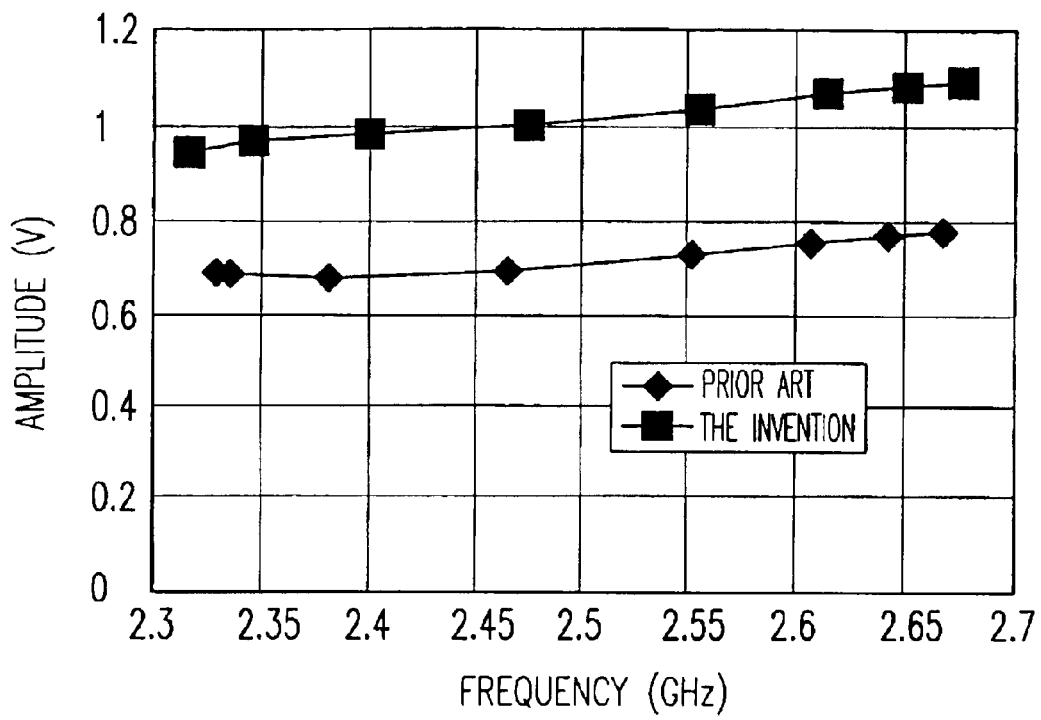
FIG. 5 is a comparative diagram of the characteristic curves of output amplitude in relation to different operation frequencies using the second preferred embodiment.
Figure 6:
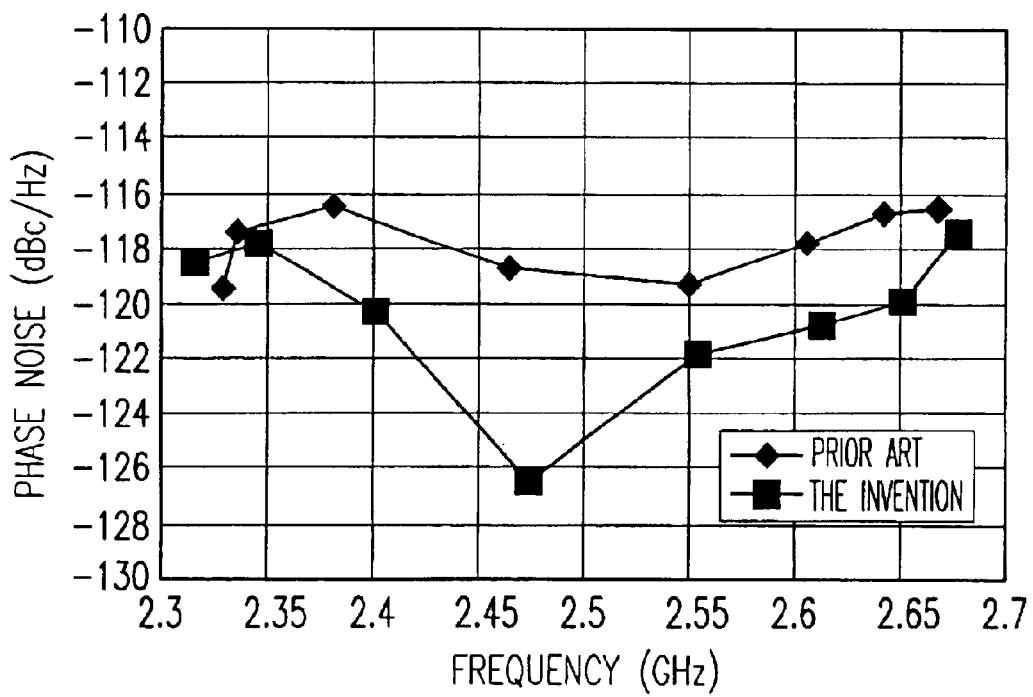
FIG. 6 is a comparative diagram of the characteristic curves of phase noise in relation to different operation frequencies using the second preferred embodiment.

Another preferred embodiment of the invention is shown in FIG. 3. With the same basic architecture as the previous example, in the second embodiment n-channel MOSFET is employed for the constant current sources (17) (18), and LC circuits (13) (14) are formed by symmetrical inductor pairs (L1, L2) (L3, L4) and varactor pairs (C1, C2) (C3, C4), wherein the varactor pairs (C1, C2) (C3, C4) are formed by MOSFET transistors. The circuit action using the foregoing architecture is simulated in FIG. 4, in which the characteristic curve in the present invention is denoted by square dots, as compared with the characteristics curve for the conventional oscillator is denoted by square dots. To compare the circuit performance, both conventional oscillator and the present invention use the same current sources and varactors setup with the same frequency range 2.33–2.67 GHz. The output amplitude and phase noise distribution for different output frequencies are respectively shown in FIGS. 5, 6. It is found that the output amplitude in the present invention is 30% larger as compared with the conventional quadrature oscillators, and the phase noise is lower by 2–4 dB.

Figure 7:
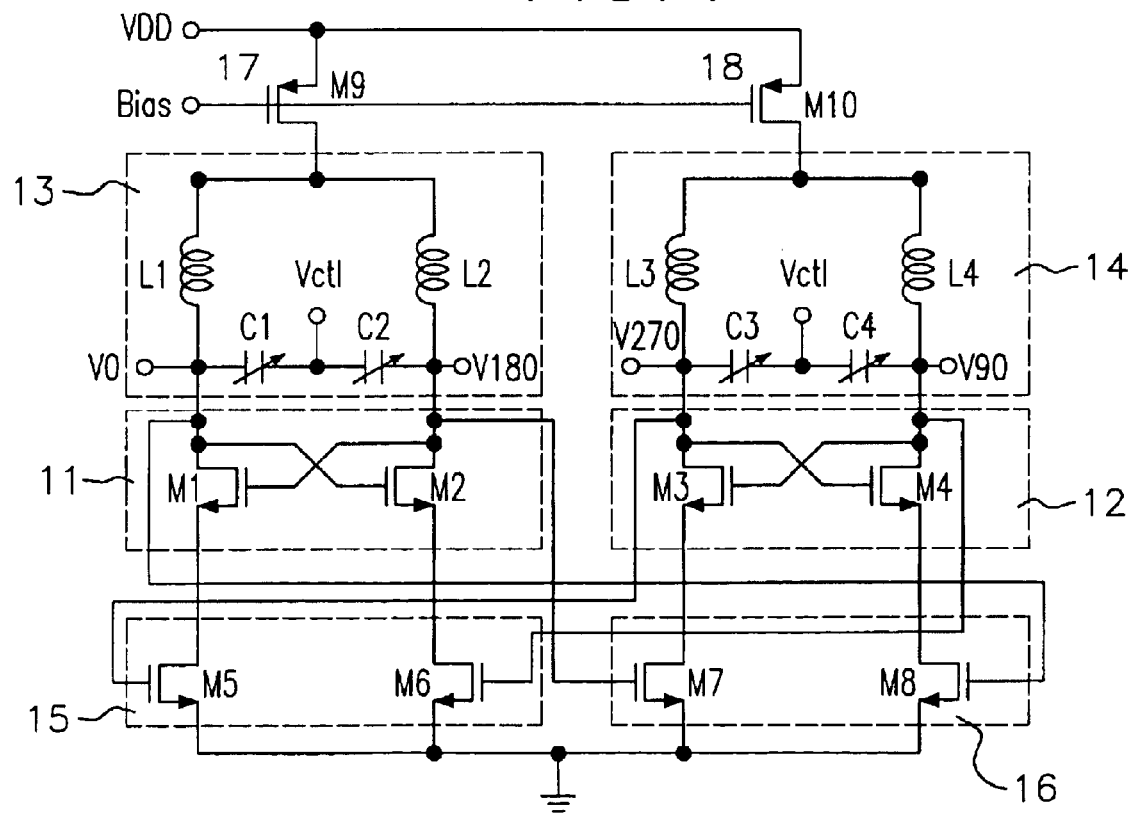
FIG. 7 is a schematic diagram of the circuit in the quadrature oscillator in accordance with the third embodiment of the invention.
Figure 8:
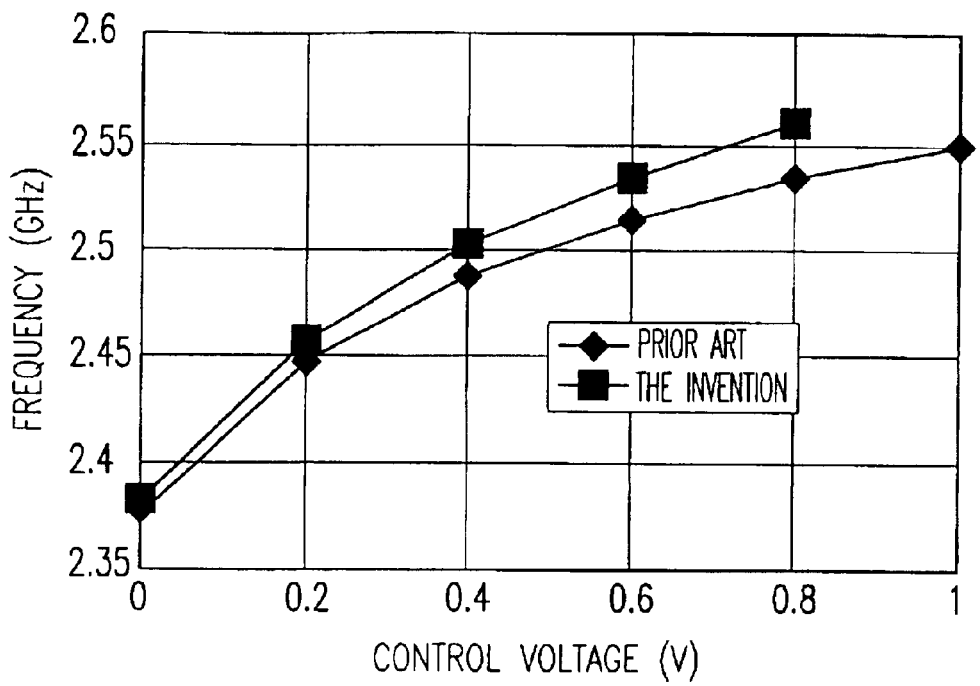
FIG. 8 is a comparative diagram of the characteristic curves of oscillation frequency in relation to different control voltages using the third preferred embodiment.
Figure 9:
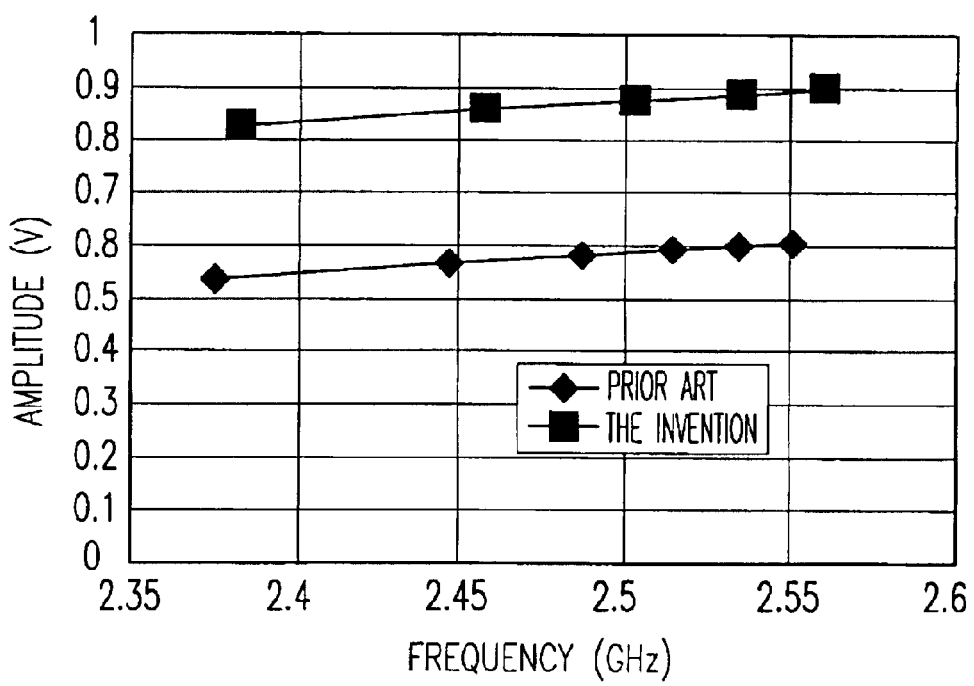
FIG. 9 is a comparative diagram of the characteristic curves of output amplitude in relation to different operation frequencies using the third preferred embodiment.
Figure 10:
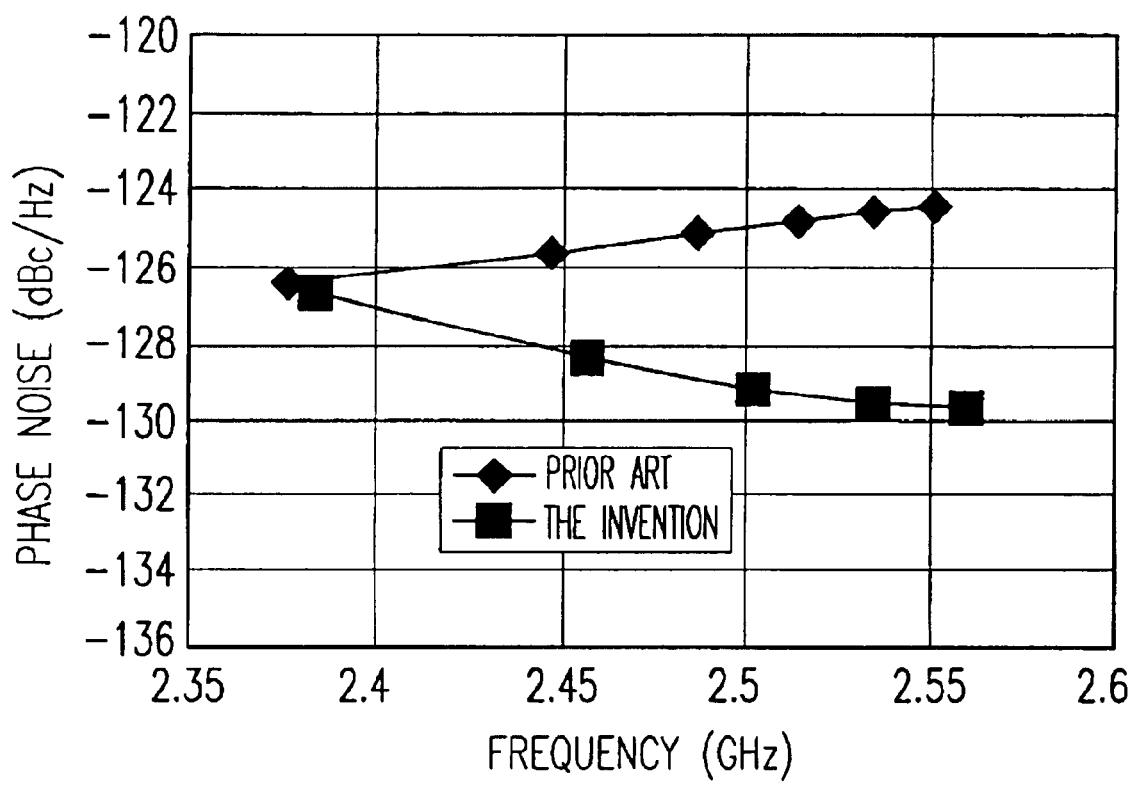
FIG. 10 is a comparative diagram of the characteristic curves of phase noise in relation to different operation frequencies using the third embodiment.

Still another embodiment of the quadrature oscillator is shown in FIG. 7, in which the constant current sources (17) (18) are implemented by p-channel MOSFET, whilst other components are similar to the previous example. In FIG. 8, using this oscillator architecture to simulate the circuit action, the characteristics curve (oscillation frequency versus control voltage) in the present invention is denoted by square dots, and the characteristics curve for the conventional oscillator is denoted by triangular dots. Both conventional oscillator and the present invention use the same current sources and varactor setup with the same frequency range 2.37–2.55 GHz. The output amplitude and phase noise distribution curves for different output frequencies are respectively shown in FIGS. 9, 10. The output amplitude in the present invention is considerably larger than in the conventional quadrature oscillators, and the phase noise is considerably lower.

In summary, the quadrature oscillator in the pre sent invention has the advantages of larger amplitude and low er phase noise as compared with the conventional oscillator, whereby the output terminal does not need any extra amplifier, thus simplifying the circuitry which accordingly has allow power consumption, and boosting the signal to noise ratio to prevent noise interference.

The quadrature oscillator in the present invention provides quadrature phase outputs, suitable for application in wireless communication with low phase noise and low power dissipation. In addition, the present invention also gives circuit designers freedom for optimizing the oscillation frequency and frequency range.

The foregoing description of the preferred embodiments of the present invention is intended to be illustrative only and, under no circumstances, should the scope of the present invention be so restricted.

What is claimed is:

1. A quadrature oscillator comprising:
   two symmetrical oscillators (11) (12), each being connected by two transistors (M1, M2) (M3, M4) self-coupled in a positive feedback structure to produce negative resistance;
   two LC circuits (13) (14), being connected to the respective oscillator (11) (12) to produce positive resistance offsetting the negative resistance through the above oscillator (11) (12);
   two coupling circuits (15) (16) being series connected to the respective oscillators (11) (12) and LC circuits (13) (14) to produce quadrature phase outputs; wherein the two coupling circuits (15) (16) are each formed by two transistors (M5, M6), (M7, M8); whereby
   gate terminals of the transistor pairs of the two coupling circuit (M5, M6), (M7, M8) are respectively connected to the drain terminals of the transistor pairs (M1, M2) (M3, M4) in the oscillators (11) (12),
   the transistor pairs of the two coupling circuit (M5, M6), (M7, M8) are respectively connected to constant current sources (17) (18); and
   drain terminals of the transistor pairs (M5, M6) (M7, M8) in the coupling circuits (15) (16) are respectively connected in series to the source terminals of the transistor pairs (M1, M2) (M3, M4) in the oscillators (11) (12).

2. The quadrature oscillator as claimed in claim 1, wherein the two transistor pairs (M5, M6) (M7, M8) in the coupling circuit (15) (16) are series connected to the transistor pairs (M1, M2) (M3, M4) in the oscillators (11) (12) to share the same current sources, and the gate terminals of the transistors (M5, M6) (M7, M8) in the coupling circuits (15) (16) are cross-coupled to outputs of LC circuits (13) (14) at junctions (V0, V180, V270, V90) to produce output signals with 90 degrees phase shift.

3. The quadrature oscillator as claimed in claim 1, wherein the oscillators (11) (12) are series connected by the constant current sources (17) (18), which are formed by n-channel MOSFET.

4. The quadrature oscillator as claimed in claim 1, wherein the oscillators (11) (12) are series connected by the constant current sources (17) (18) which are formed by p-channel MOSFET.

5. The quadrature oscillator as claimed in claim 1, wherein the LC circuits (13) (14) are each formed by a pair of symmetrical inductors and varactors.

6. The quadrature oscillator as claimed in claim 2, wherein the LC circuits (13) (14) are each formed by a pair of symmetrical inductors and varactors.

7. The quadrature oscillator as claimed in claim 3 wherein the LC circuits (13) (14) are each formed by a pair of symmetrical inductors and varactors.

8. The quadrature oscillator as claimed in claim 4, wherein the LC circuits (13) (14) are each formed by a pair of symmetrical inductors and varactors.

* * * * *